US012796228B2

(12) United States Patent
Zhao

(10) Patent No.: US 12,796,228 B2
(45) Date of Patent: Nov. 10, 2026

(54) DISPLAY SUBSTRATE, MANUFACTURING METHOD THEREFOR AND DISPLAY DEVICE

(71) Applicant: BOE Technology Group Co., Ltd., Beijing (CN)

(72) Inventor: Dejiang Zhao, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 565 days.

(21) Appl. No.: 18/278,855

(22) PCT Filed: Nov. 29, 2022

(86) PCT No.: PCT/CN2022/135168

§ 371 (c)(1),
(2) Date: Aug. 25, 2023

(87) PCT Pub. No.: WO2024/113186

PCT Pub. Date: Jun. 6, 2024

(65) Prior Publication Data

US 2025/0081733 A1 Mar. 6, 2025

(51) Int. Cl.

| | |
|---|---|
| ***H10K 59/122*** | (2023.01) |
| ***H10K 59/12*** | (2023.01) |
| ***H10K 71/13*** | (2023.01) |
| *H10K 102/00* | (2023.01) |

(52) U.S. Cl.

CPC ....... *H10K 59/122* (2023.02); *H10K 59/1201* (2023.02); *H10K 71/135* (2023.02); *H10K 2102/351* (2023.02)

(58) Field of Classification Search

CPC ............. H10K 59/122; H10K 59/1201; H10K 71/135; H10K 2102/351

See application file for complete search history.

(56) References Cited

U.S. PATENT DOCUMENTS

2018/0138255 A1 5/2018 Lee et al.
2019/0157607 A1 * 5/2019 Kim ........................ H10K 59/88
2019/0189923 A1 6/2019 Cui

FOREIGN PATENT DOCUMENTS

CN 107464832 A 12/2017
CN 108063155 A 5/2018
CN 115295741 A 11/2022
KR 20180076792 A 7/2018
KR 20220036556 A 3/2022

* cited by examiner

*Primary Examiner* — Douglas M Menz

(57) ABSTRACT

A display substrate including a base substrate and a light emitting structure layer disposed on the base substrate, the light emitting structure layer includes at least one light emitting element and a composite dielectric layer located on at least one side of the light emitting element; the light emitting element includes a support layer, and an anode, a partition layer and a light emitting functional layer disposed on the support layer, a surface of the support layer away from the base substrate is higher than a surface of the composite dielectric layer away from the base substrate, the partition layer and the anode form an accommodation groove, at least a portion of the light emitting functional layer is disposed in the accommodation groove and connected with the anode, and at least a portion of the light emitting functional layer and the composite dielectric layer are disconnected from each other.

19 Claims, 4 Drawing Sheets

DISPLAY SUBSTRATE, MANUFACTURING METHOD THEREFOR AND DISPLAY DEVICE

CROSS-REFERENCE TO RELATED APPLICATION

The present disclosure is a U.S. National Phase Entry of International Application PCT/CN2022/135168 having an international filing date of Nov. 29, 2022, and the contents disclosed in the above-mentioned application are incorporated herein by reference.

TECHNICAL FIELD

Embodiments of the present disclosure relate to, but are not limited to, the field of display technology, and particularly to a display substrate, a method manufacturing for a display substrate, and a display device.

BACKGROUND

Organic Light-Emitting Diode (OLED) panel is an active light emitting display device, which has advantages such as self-luminescence, wide viewing angle, high contrast ratio, full-color display, light weight, thinness, low power consumption, high reaction speed, and can achieve flexible display.

Ink-jet printed OLED devices have the advantages of saving materials and ease of mass production. However, due to the limitation of ink droplet size, it is not easy to print fine patterns using an ink jet printing process.

SUMMARY

The following is a summary of subject matter described herein in detail. The summary is not intended to limit the protection scope of claims.

An embodiment of the present disclosure provides a display substrate, including a base substrate and a light emitting structure layer disposed on the base substrate, the light emitting structure layer includes at least one light emitting element and a composite dielectric layer located on at least one side of the at least one light emitting element; the at least one light emitting element includes a support layer, and an anode, a partition layer and a light emitting functional layer disposed on the support layer, a surface of the support layer away from the base substrate is higher than a surface of the composite dielectric layer away from the base substrate, the partition layer and the anode form an accommodation groove, at least a portion of the light emitting functional layer is disposed in the accommodation groove and connected with the anode, and at least a portion of the light emitting functional layer and the composite dielectric layer are disconnected from each other.

In an exemplary embodiment, the partition layer is disposed at an edge of the support layer, orthographic projections of the partition layer and the anode on the base substrate are not overlapped with each other; or, the partition layer is disposed at an edge of the anode.

In an exemplary embodiment, a distance from a surface of the light emitting functional layer located in the accommodation groove away from the support layer to the support layer is not greater than a distance from a surface of the partition layer away from the support layer to the support layer.

In an exemplary embodiment, the partition layer is in a form of ring and disposed along a periphery of the anode.

In an exemplary embodiment, a ring width of the partition layer is less than 3.0 microns.

In an exemplary embodiment, the display substrate further includes a pixel circuit layer disposed on the base substrate and a planarization layer disposed on the pixel circuit layer, wherein the light emitting structure layer is disposed on the planarization layer.

In an exemplary embodiment, a distance from the surface of the support layer away from the base substrate to a surface of the planarization layer away from the base substrate is 0.2 microns to 0.8 microns.

In an exemplary embodiment, the partition layer includes an organic insulation material or an inorganic insulation material.

In some exemplary embodiments, a thickness of the partition layer is 30 nm to 100 nm.

In an exemplary embodiment, the light emitting functional layer includes a plurality of film layers; the composite dielectric layer and at least one film layer of the light emitting functional layer includes a same material; the composite dielectric layer and the at least one film layer of the light emitting functional layer including the same material are disconnected from each other at the partition layer.

In an exemplary embodiment, a plurality of the light emitting elements are arranged at intervals to form a light emitting element group, and the composite dielectric layer is disposed between adjacent light emitting elements in the light emitting element group.

In an exemplary embodiment, the light emitting structure layer further includes an isolation dam disposed on the base substrate, the isolation dam surrounds a periphery of the light emitting element group, and a surface of the isolation dam away from the base substrate is higher than a surface of the partition layer away from the base substrate.

In an exemplary embodiment, the support layer and the partition layer are made of a same material as the isolation dam.

A display device includes the display substrate described in any of the above embodiments.

A method for manufacturing a display substrate includes the following steps:

- forming at least one support layer and an isolation dam on a base substrate;
- forming an anode and a partition layer on the at least one support layer, wherein the partition layer and the anode form an accommodation groove;
- depositing an ink thin film on the base substrate, wherein the ink thin film covers the accommodation groove and fills outside the support layer and is located in a region defined by the isolation dam;
- making the ink thin film located inside the accommodation groove form at least a portion of a light emitting functional layer, wherein the light emitting functional layer is connected with the anode; and
- making the ink thin film located outside the support layer form a composite dielectric layer, wherein an orthographic projection of the composite dielectric layer on the base substrate and an orthographic projection of at least a portion of the light emitting functional layer on the substrate are not overlapped with each other, and a surface of the support layer away from the base substrate is higher than a surface of the composite dielectric layer away from the base substrate.

Other aspects may be understood upon reading and understanding of the drawings and detailed description.

BRIEF DESCRIPTION OF DRAWINGS

Accompanying drawings are intended to provide a further understanding of technical solutions of the present disclosure and form a part of the specification, and are used to explain the technical solutions of the present disclosure together with embodiments of the present disclosure, and do not form limitations on the technical solutions of the present disclosure. Shapes and sizes of components in the drawings do not reflect actual scales, and are only intended to schematically illustrate contents of the present disclosure.

DETAILED DESCRIPTION

Figure 1:
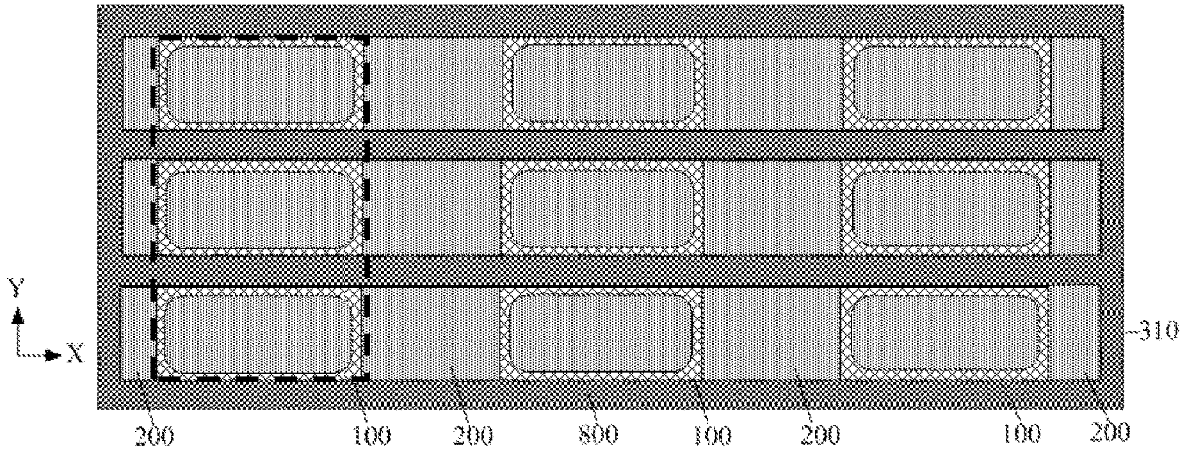
FIG. 1 is a top schematic diagram of a display substrate according to an embodiment of the present disclosure.

To make objectives, technical solutions, and advantages of the present disclosure clearer, the embodiments of the present disclosure will be described in detail with reference to the accompanying drawings. Implementations may be practiced in a plurality of different forms. Those of ordinary skills in the art may easily understand such a fact that implementations and contents may be transformed into one or more forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one implementation of the present disclosure is not necessarily limited to the sizes, and shapes and sizes of various components in the drawings do not reflect actual scales. In addition, the drawings schematically illustrate ideal examples, and one implementation of the present disclosure is not limited to shapes, numerical values, or the like shown in the drawings.

Ordinal numerals such as "first", "second" and "third" in the present disclosure are set to avoid confusion between constituent elements, but not intended for restriction in quantity. In the description of the present disclosure, "a plurality of" means two or more than two.

In the present disclosure, for convenience, wordings "central", "up", "down", "front", "back", "vertical", "horizontal", "top", "bottom", "inside", "outside" and the like indicating in orientation or positional relationships are used to illustrate positional relationships between constituent elements with reference to the drawings, which are only used to facilitate describing the present specification and simplify the description, rather than indicating or implying that involved devices or elements must have specific orientations and be structured and operated in the specific orientations, and thus should not be understood as limitations on the present disclosure. The positional relationships between the constituent elements are changed as appropriate based on directions for describing the constituent elements. Therefore, appropriate replacements may be made according to situations without being limited to the wordings described in the specification.

In the present disclosure, unless otherwise specified and defined, terms "mounting", "mutual connection" and "connection" should be understood in a broad sense. For example, a connection may be a fixed connection, a detachable connection, or an integrated connection; it may be a mechanical connection or an electrical connection; it may be a direct connection, an indirect connection through a middleware, or an internal communication inside between two components. Those of ordinary skills in the art may understand meanings of the above-mentioned terms in the present disclosure according to situations.

In the present disclosure, a transistor refers to an element including at least three terminals, namely, a gate electrode, a drain electrode and a source electrode. The transistor has a channel region between the drain electrode (drain electrode terminal, drain area, or drain) and the source electrode (source electrode terminal, source area, or source), and a current can flow through the drain electrode, the channel region and the source electrode. In the present disclosure, the channel region refers to a region through which the current mainly flows.

In the present disclosure, a first electrode may be a drain electrode while a second electrode may be a source electrode, or a first electrode may be a source electrode while a second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present disclosure.

In the present disclosure, "connection" includes a case where constituent elements are connected through an element with a certain electrical action. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, other elements with one or more functions, etc.

In the present disclosure, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 10°, and thus may include a state in which the angle is above 85° and below 95°.

In the present disclosure, "film" and "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

In some related technologies, a method of Line bank (retaining wall) or subdivided anode is used for implementing fine pattern printing. However, through the inventor's research, it is found that when the line bank printing method is adopted, ink backflow will occur at a position near the line bank during the ink drying process, which will lead to abnormal thickness of the ink at this position, thus affecting the display effect.

The present disclosure provides a display substrate, including a base substrate and a light emitting structure layer disposed on the base substrate. The light emitting structure layer includes at least one light emitting element and a composite dielectric layer located on at least one side of the light emitting element. The at least one light emitting element includes a support layer, and an anode, a partition layer and a light emitting functional layer disposed on the support layer. A surface of the support layer away from the base substrate is higher than a surface of the composite dielectric layer away from the base substrate, and the partition layer and the anode form an accommodation groove. At least a portion of the light emitting functional layer is disposed in the accommodation groove and connected with the anode, and at least a portion of the light emitting functional layer and the composite dielectric layer are disconnected from each other.

The display substrate includes the support layer, the anode and the partition layer arranged on the support layer, and the partition layer and the anode form the accommodation groove, at least a portion of the light emitting functional layer is disposed in the accommodation groove and connected with the anode, so that occurrence of ink backflow can be avoided in a process of forming the light emitting functional layer by ink jet printing, uniformity of the thickness of the light emitting functional layer can be improved, and display effect of a display product can be improved.

The technical solutions of the embodiments of the present disclosure will be illustrated in detail below by the embodiments.

FIG. 1 is a top schematic diagram of a display substrate according to an embodiment of the present disclosure. As shown in FIG. 1, three directions are defined for ease of description of the technical solutions, and a first direction is identified as X and a second direction is identified as Y. The first direction intersects with the second direction. In the embodiment of the present disclosure, any two of the first direction, the second direction and a third direction are perpendicular to each other. The third direction is a thickness direction of the display substrate.

In an exemplary implementation, as shown in FIG. 1, the display substrate according to the embodiment of the present disclosure includes a base substrate 310, a pixel circuit layer disposed on the base substrate 310, a planarization layer disposed on the pixel circuit layer, and a light emitting structure layer disposed on the planarization layer.

In an exemplary implementation, the pixel circuit layer may include a plurality of transistors and a storage capacitor. A transistor may include an active layer, a gate electrode, a source electrode and a drain electrode, the gate electrode is located on one side of the active layer and insulated from the active layer, the source electrode and the drain electrode are electrically connected to the active layer, respectively.

In an exemplary implementation, as shown in FIG. 1, the light emitting structure layer includes at least one light emitting element 100 and at least one composite dielectric layer 200. Both the at least one light emitting element 100 and the composite dielectric layer 200 are disposed on the planarization layer. The composite dielectric layer 200 is located on at least one side of the at least one light emitting element 100.

In an exemplary implementation, as shown in FIG. 1, a plurality of light emitting elements 100 are arranged at intervals along the first direction to form a light emitting element group, the composite dielectric layer 200 is located on opposite sides of the light emitting elements 100 in the first direction. An orthographic projection of the composite dielectric layer 200 on the base substrate 310 is not overlapped with an orthographic projection of the light emitting elements 100 on the base substrate 310, and for example, the light emitting elements 100 and the composite dielectric layer 200 may be alternately arranged in sequence along the first direction.

In an exemplary implementation, as shown in FIG. 1, the light emitting structure layer further includes an isolation dam 800 disposed along a periphery of the light emitting element group for limiting an ink material, so that the ink material is limited in a space enclosed by the isolation dam 800.

In an exemplary implementation, the display substrate may include a plurality of pixel units arranged in a matrix, and each pixel unit includes at least 3 sub-pixels. In the embodiment of the present disclosure, only taking each pixel unit including 3 sub-pixels as an example, one pixel unit is shown in the dashed box in FIG. 1. FIG. 1 illustrates only an arrangement of a plurality of sub-pixels within a pixel unit, which is not limited in the present disclosure. As shown in FIG. 1, along the second direction, one pixel unit may include a first sub-pixel, a second sub-pixel and a third sub-pixel arranged in sequence. The first sub-pixel may be a red sub-pixel R, the second sub-pixel may be a green sub-pixel G, and the third sub-pixel may be a blue sub-pixel B. Different sub-pixels are separated from each other by the isolation dam 800.

In an exemplary implementation, as shown in FIG. 1, an orthographic projection of the isolation dam 800 on the base substrate 310 may be rectangular, and the isolation dam 800 includes first edge portions extending along the first direction and second edge portions extending along the second direction. The first edge portions are located on opposite sides of the light emitting element group along the second direction, and the second edge portions are located on opposite sides of the light emitting element group along the first direction.

In an exemplary implementation, the projection of the light emitting elements 100 on XY plane may be rectangular or the like. The projection of the composite dielectric layer 200 on the XY plane may be rectangular or the like. Shapes of the light emitting elements 100 and the composite dielectric layer 200 are not limited in the implementation of the present disclosure.

In the exemplary embodiment, on the XY plane, an area of the projection of the light emitting elements 100 and an area of the projection of the composite dielectric layer 200 may be designed to be the same, and a ratio of the light emitting elements 100 to the composite dielectric layer 200 in the display substrate may be disposed to be 1:1 or 2:1 or the like, so as to facilitate adjustment of the display effect of the display substrate.

In an exemplary embodiment, the light emitting structure layer includes a plurality of light emitting element groups. Each light emitting element group is configured to emit different monochromatic light. In the embodiment of the present disclosure, the first light emitting element group is configured to emit a first monochromatic light, the second light emitting element group is configured to emit a second monochromatic light, and the third light emitting element group is configured to emit a third monochromatic light. In the embodiment of the present disclosure, the first monochromatic light is defined as red light, the second monochromatic light is defined as green light, and the third monochromatic light is defined as blue light, for example. As shown in FIG. 1, the first light emitting element group, the second light emitting element group and the third light emitting element group may be sequentially arranged along the second direction.

Figure 2:
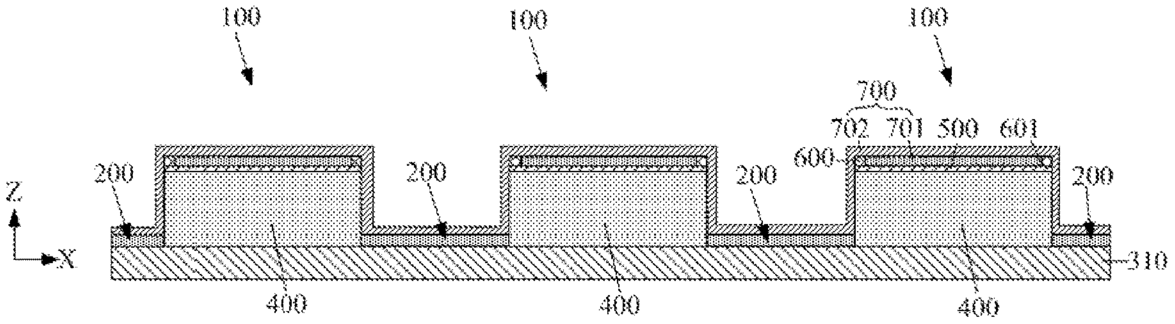
FIG. 2 is a schematic cross-sectional view of a display substrate along a first direction according to an embodiment of the present disclosure.

FIG. 2 is a schematic cross-sectional view of a display substrate along a first direction according to an embodiment of the present disclosure. As shown in FIG. 2, in the embodiment of the present disclosure, the third direction is identified as Z.

In an exemplary implementation, as shown in FIG. 2, each light emitting element 100 includes a support layer 400. A surface of the support layer 400 away from the base substrate 310 is higher than a surface of the composite dielectric layer 200 away from the base substrate 310.

In an exemplary implementation, a material of the support layer 400 may be polyimide, acrylic, polyethylene terephthalate, or the like.

In an exemplary implementation, a thickness of the support layer 400 (in the third direction) may be configured to be 0.2 microns to 0.8 microns, for example, 0.3 microns.

In an exemplary implementation, a spacing between two adjacent support layers 400 along the first direction may be configured to be 3.0 microns or greater than 3.0 microns, so as to reduce a manufacturing difficulty of the support layer 400 and reduce manufacturing costs of the display substrate.

In an exemplary implementation, as shown in FIG. 2, the light emitting element 100 further includes an anode 500 disposed on a side of the support layer 400 away from the base substrate 310. An orthographic projection of the anode 500 on the base substrate 310 is at least partially overlapped with an orthographic projection of the support layer 400 on the base substrate 310. For example, the orthographic projection of the anode 500 on the base substrate 310 may be configured to coincide with the orthographic projection of the support layer 400 on the base substrate 310. Or, the orthographic projection of the anode 500 on the base substrate 310 is within the orthographic projection of the support layer 400 on the base substrate 310, or the like.

In an exemplary implementation, as shown in FIG. 2, the anode 500 is not disposed on the base substrate 310 between adjacent support layers 400, i.e. the orthographic projection of the anode 500 on the base substrate 310 is not overlapped with the base substrate 310 between adjacent support layers 400.

In some exemplary embodiments, the anode 500 may be made of a metal material, such as one or more of magnesium (Mg), silver (Ag), Copper (Cu), Aluminum (Al), Titanium (Ti), and Molybdenum (Mo). Or, the anode 500 may be made of an alloy material of metals such as magnesium (Mg), silver (Ag), copper (Cu), aluminum (Al), titanium (Ti), and molybdenum (Mo), for example, an aluminum-neodymium alloy (AlNd), a molybdenum-niobium alloy (MoNb), or the like.

In an exemplary implementation, the anode 500 may have a single-layer structure or a multi-layer composite structure, such as Ti/Al/Ti. Or, the anode 500 is in a stacked structure formed of a metal and a transparent conductive material, such as ITO/Ag/ITO (ITO, indium tin oxide) or Mo/AlNd/ITO or the like. Taking the anode 500 being provided in an ITO/Ag/ITO structure as an example, a thickness of an ITO layer may be configured to be 8.0 nm, and a thickness of an Ag layer may be configured to be 100 nm. The present disclosure is not limited thereto with regard to the thickness, material and structure of the anode 500.

In an exemplary implementation, as shown in FIG. 2, the light emitting element 100 further includes an partition layer 600 disposed on the side of the support layer 400 away from the base substrate 310. The partition layer 600 may be disposed at an edge of the support layer 400, and an orthographic projection of the partition layer 600 on the base substrate 310 is not overlapped with the orthographic projection of the anode 500 on the base substrate 310. Or, as shown in FIG. 2, the partition layer 600 is disposed on an edge of the anode 500.

In an exemplary implementation, the partition layer 600 may be provided as a single-layer film layer, or a composite film layer of multiple layers, or the like.

In an exemplary implementation, the partition layer 600 may be provided as an organic insulation material, such as one of polyimide (PI), polyacrylate, polyphenylene sulfide, polyaryl ester, cellulose acetate propionate, polyethylene naphthalate (PEN), polyethylene terephthalate (PET), polyethersulfone resin (PES), polycarbonate (PC), polyetherimide (PEI), cycloolefin polymer (COP), silica gel resin, polyaryl compound (PAR) or glass fiber reinforced plastic (FRP), or a mixture of a plurality of polymers.

In an exemplary implementation, the partition layer 600 may be provided as an inorganic insulation material, and may include, for example, any one of silicon oxynitride (SiOxNy), silicon nitride (SiN), silicon oxide (SiO), silicon dioxide ($SiO_2$), aluminum oxide ($Al_2O_3$), titanium dioxide ($TiO_2$), niobium pentoxide ($Nb_2O_5$), and the like.

In an exemplary implementation, a material of the partition layer 600 may be a material with a relatively high surface energy, for example, polycarbonate (PC), polyphenylene ether (PPO), polyester synthetic fiber (PET), polypropylene (PSU), polyimide (PI), or the like. Materials with higher surface energy have stronger hydrophilicity. During a drying process of ink for inkjet printing, the ink will break at the support layer 400 and transition naturally, which can improve the display effect. For example, the surface energy of the material of the partition layer 600 may be disposed to be 50 to 100 $J/m^2$.

In an exemplary implementation, a thickness of the partition layer 600 may be configured to be 30 nm to 100 nm. If the thickness of the partition layer 600 is configured to be too large, nk distribution at the edge of the anode 500 is easily affected, and if the thickness of the partition layer 600 is configured to be too small, the anode 500 cannot be effectively covered, thereby affecting a service life of the display substrate.

In an exemplary implementation, as shown in FIG. 2, the partition layer 600 and the anode 500 form an accommodation groove 601, a sidewall of the accommodation groove 601 is a sidewall of the partition layer 600, and a bottom wall of the accommodation groove 601 is a surface of the anode 500 away from the support layer 400. An projection of the accommodation groove 601 on the XY plane may be circular or rectangular or the like.

In an exemplary implementation, the partition layer 600 is in a form of ring and a ring width of the partition layer 600 is less than 3.0 microns.

In an exemplary implementation, as shown in FIG. 2, the light emitting element 100 further includes a light emitting functional layer 700 disposed on a side of the anode 500 away from the base substrate 310. At least a portion of the light emitting functional layer 700 may be disposed in the accommodation groove 601, and at least a portion of the light emitting functional layer 700 is connected to the anode 500. At least a portion of the light emitting functional layer 700 may be not overlapped with the orthographic projection of the partition layer 600 on the plane where the display substrate is located. In an exemplary implementation, the display substrate further includes a cathode disposed on a side of the light emitting functional layer 700 away from the base substrate 310, and the light emitting functional layer 700 can emit light of a predefined color driven by the anode 500 and the cathode.

In an exemplary implementation, as shown in FIG. 2, a distance from a surface of the light emitting functional layer 700 in the accommodation groove 601 away from the support layer 400 to the support layer 400 is not greater than a distance from a surface of the partition layer 600 away from the support layer 400 to the support layer 400. For example, the distance from the light emitting functional layer 700 in the accommodation groove 601 to the support layer 400 is smaller than the distance from the partition layer 600 to the support layer 400, so that backflow of printing ink during the drying process can be prevented, then the uniformity of the light emitting functional layer 700 can be improved, and the display effect of the display product can be improved.

In an exemplary implementation, the light emitting functional layer 700 includes a plurality of film layers. The composite dielectric layer 200 and at least one film layer of the light emitting functional layer 700 includes a same material. The composite dielectric layer 200 and the film layer of the light emitting functional layer 700 including the same material are disconnected from each other at the partition layer 600 to facilitate formation of the light emitting functional layer 700 with a uniform film thickness.

In an exemplary implementation, as shown in FIG. 2, the partition layer 600 may be in a form of ring and may be disposed along a periphery of the anode 500. In an exemplary implementation, the light emitting functional layer 700 may include a multi-layer structure formed by one or more film layers of an Emitting Layer (EML), a Hole Injection Layer (HIL), a Hole Transport Layer (HTL), a Hole Block Layer (HBL), an Electron Block Layer (EBL), an Electron Injection Layer (EIL), and an Electron Transport Layer (ETL).

In an exemplary implementation, as shown in FIG. 2, the light emitting functional layer 700 may include a first portion 701 and a second portion 702. The second portion 702 is located on a side of the first portion 701 away from the base substrate 310. The first portion 701 may be disconnected from the composite dielectric layer 200 at the partition layer 600 and an orthographic projection of the first portion 701 on the base substrate 310 is not overlapped with the orthographic projection of the partition layer 600 on the base substrate 310. The first portion 701 may include the light emitting layer (EML) or the like. An orthographic projection of the second portion 702 on the base substrate 310 may cover the orthographic projections of the support layer 400 and the composite dielectric layer 200 on the base substrate 310, and the second portion 702 may include the Electron Injection Layer (EIL) or the like.

Figure 3:
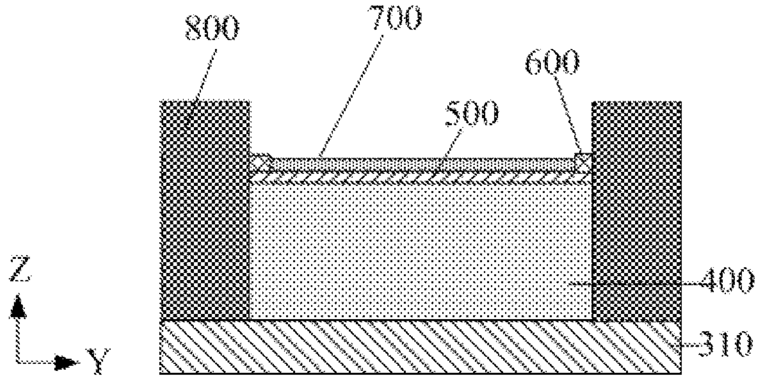
FIG. 3 is a schematic cross-sectional view of a display substrate along a second direction according to an embodiment of the present disclosure.

In an exemplary implementation, the second portion 702 is disconnected from the composite dielectric layer 200 at the partition layer 600. FIG. 3 is a schematic cross-sectional view of a display substrate along a second direction according to an embodiment of the present disclosure. As shown in FIG. 3, the first portion 701 and the second portion 702 are no longer distinguished, and for example, the light emitting functional layer 700 is disconnected from the composite dielectric layer 200 at the partition layer 600.

As shown in FIG. 3, a width of the second edge portion of the isolation dam 800 (along the second direction) may be configured to be 10 microns to 30 microns.

In an exemplary implementation, as shown in FIG. 3, a thickness of the isolation dam 800 (along the third direction) may be configured to be 1.2 microns to 2.5 microns.

In an exemplary implementation, as shown in FIG. 3, the thickness of the isolation dam 800 is greater than the thickness of the support layer 400. There is a segment difference along the third direction between the partition layer 600 and the isolation dam 800, and a surface of the partition layer 600 is closer to the base substrate 310 than a surface of the isolation dam 800. That is, a surface of the insulating dam 800 away from the base substrate 310 is higher than a surface of the insulation layer 600 away from the base substrate 310, which prevents the occurrence of ink backflow during a drying process and facilitates obtaining the light emitting functional layer 700 with uniform film thickness.

In an exemplary implementation, a material of the isolation dam 800 may be provided as an organic material. The organic material may include, for example, one of polyimide (PI), polyacrylate, polyphenylene sulfide, polyaryl ester, cellulose acetate propionate, polyethylene naphthalate (PEN), polyethylene terephthalate (PET), polyethersulfone resin (PES), polycarbonate (PC), polyetherimide (PEI), cycloolefin polymer (COP), silica gel resin, polyaryl compound (PAR) or glass fiber reinforced plastic (FRP), or a mixture of a plurality of polymers.

In an exemplary implementation, the material of the isolation dam 800 may be provided as an inorganic material. The inorganic material may include, for example, any one of silicon oxynitride (SiOxNy), silicon nitride (SiN), silicon oxide (SiO), silicon dioxide ($SiO_2$), aluminum oxide ($Al_2O_3$), titanium dioxide ($TiO_2$), niobium pentoxide ($Nb_2O_5$), and the like.

In an exemplary implementation, the materials of the support layer 400 and the partition layer 600 and the isolation dam 800 may be a same material, which may reduce the types of materials contained in the display substrate and facilitate the reduction of the cost of the display substrate.

Figure 4:
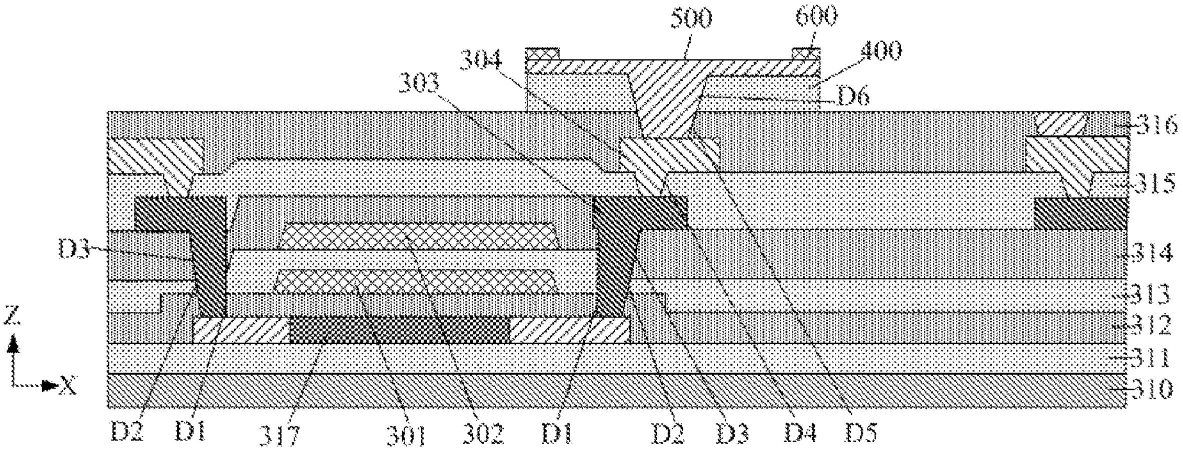
FIG. 4 is an enlarged partial cross-sectional view of a display substrate along a first direction according to an embodiment of the present disclosure.

FIG. 4 is an enlarged partial cross-sectional view of a display substrate along a first direction according to an embodiment of the present disclosure. In an exemplary implementation, as shown in FIG. 4, the display substrate includes the base substrate 310 and a pixel circuit layer disposed on the base substrate 310. The pixel circuit layer includes a plurality of drive circuits, as shown in FIG. 4, and only one drive circuit is illustrated as an example.

In an exemplary implementation, the base substrate 310 may be a rigid substrate, or may be a flexible substrate, or may be a silicon wafer, or the like. In an exemplary implementation, the rigid substrate may be made of a material such as glass or quartz, and the flexible substrate may be made of a material such as polyimide (PI) or polyethylene terephthalate (PET). The flexible substrate may be in a single-layer structure, or may be in a stacked structure composed of an inorganic material layer and a flexible material layer, or the like, which is not limited in the present disclosure.

In an exemplary implementation, as shown in FIG. 4, the display substrate may further include a first insulation layer 311 located on a side of the base substrate 310 close to the support layer 400. The first insulation layer 311 is referred to as a buffer layer, and is used for improving water and oxygen resistance of the display substrate.

In an exemplary implementation, the first insulation layer 311 may include any one or more of silicon oxynitride ($SiO_xN_y$), silicon nitride (SiN), silicon oxide (SiO), silicon dioxide ($SiO_2$), aluminum oxide ($Al_2O_3$), titanium dioxide ($TiO_2$), niobium pentoxide ($Nb_2O_5$), and the like.

In an exemplary implementation, the first insulation layer 311 may be provided as a single-layer film layer, or a composite film layer, or the like.

In an exemplary implementation, as shown in FIG. 4, the pixel circuit layer may include an active layer 317 located on a side of the first insulation layer 311 away from the base substrate 310. The active layer 317 may include a plurality of source electrodes and drain electrodes. The active layer 317 is made of one or more of amorphous indium gallium zinc oxide (a-IGZO), zinc oxynitride (ZnON), indium zinc tin oxide (IZTO), amorphous silicon (a-Si), polycrystalline silicon (p-Si), hexathiophene, polythiophene, etc.

In an exemplary implementation, as shown in FIG. 4, the pixel circuit layer may further include a second insulation layer 312 located on a side of the active layer 317 away from the base substrate 310. The material and structure of the second insulation layer 312 may be provided to be the same as those of the first insulation layer 311.

As shown in FIG. 4, the second insulation layer 312 is provided with at least two first vias D1 penetrating a thickness thereof, one of the first vias D1 is configured to expose at least a portion of a source electrode of the active layer 317, and the other of the first vias D1 is used for exposing at least a portion of a drain electrode of the active layer 317, so as to facilitate electrical connection between the anode 500 and the active layer 317.

In an exemplary implementation, as shown in FIG. 4, the pixel circuit layer may further include a first gate 301 located on a side of the second insulation layer 312 away from the base substrate 310. The first gate 301 may be made of a metal material, such as any one or more of magnesium (Mg), silver (Ag), copper (Cu), aluminum (Al), titanium (Ti), molybdenum (Mo), and the like. Or, the first gate 301 may be made of an alloy material of metals such as magnesium (Mg), silver (Ag), copper (Cu), aluminum (Al), titanium (Ti), and molybdenum (Mo), for example, an aluminum-neodymium alloy (AlNd), a molybdenum-niobium alloy (MoNb), or the like.

In an exemplary implementation, the first gate 301 may be in a single-layer structure, or a multi-layer composite structure such as Ti/Al/Ti, or the like.

In an exemplary implementation, as shown in FIG. 4, the pixel circuit layer may further include a third insulation layer 313 located on a side of the first gate 301 away from the base substrate 310. The material and structure of the third insulation layer 313 may be provided to be the same as those of the first insulation layer 311. The second insulation layer 312 and the third insulation layer 313 are referred to as Gate Insulator (GI) layers.

As shown in FIG. 4, the third insulation layer 313 is provided with at least two second vias D2 penetrating a thickness thereof, one of the second vias D2 is configured to expose at least a portion of one first via D1 and expose at least a portion of the source electrode. The other of the second vias D2 is configured to expose at least a portion of the other of the first vias D1 and expose at least a portion of a drain electrode, so as to facilitate electrical connection between the anode 500 and the active layer 317.

In an exemplary implementation, as shown in FIG. 4, the pixel circuit layer may further include a second gate 302 located on a side of the third insulation layer 313 away from the base substrate 310. The material and structure of the second gate 302 may be provided to be the same as those of the first gate 301.

In an exemplary implementation, as shown in FIG. 4, the pixel circuit layer may further include a fourth insulation layer 314 located on a side of the second gate 302 away from the base substrate 310. The material and structure of the fourth insulation layer 314 may be provided to be the same as those of the first insulation layer 311. The fourth insulation layer 314 is referred to as an ILD (Interlayer Dielectric) layer.

As shown in FIG. 4, the fourth insulation layer 314 is provided with at least two third vias D3 penetrating a thickness thereof, one of the third vias D3 is configured to expose at least a portion of one first via D1 and expose at least a portion of a source electrode. The other of the third vias D3 is configured to expose at least a portion of the other of the first vias D1 and expose at least a portion of a drain electrode, so as to facilitate the electrical connection between the anode 500 and the active layer 317.

In an exemplary implementation, as shown in FIG. 4, the pixel circuit layer may further include a source-drain electrode 303 located on a side of the fourth insulation layer 314 away from the base substrate 310. The source-drain electrode 303 is connected to the active layer 317 through a third via D3, a second via D2 and a first via D1. The material and structure of the source-drain electrode 303 may be provided to be the same as those of the anode 500.

In an exemplary implementation, as shown in FIG. 4, the pixel circuit layer may further include a fifth insulation layer 315 located on a side of the source-drain electrode 303 away from the base substrate 310. The material and structure of the fifth insulation layer 315 may be arranged to be the same as those of the first insulation layer 311. The fifth insulation layer 315 is referred to as a passivation (PVX) layer.

As shown in FIG. 4, the fifth insulation layer 315 is provided with a fourth via D4 penetrating a thickness thereof, the fourth via D4 is configured to expose at least a portion of the source-drain electrode 303, so as to facilitate the electrical connection between the anode 500 and the active layer 317.

In an exemplary implementation, as shown in FIG. 4, the pixel circuit layer may further include a connection electrode 304 located on a side of the fifth insulation layer 315 away from the base substrate 310. The material and structure of the connection electrode 304 may be provided to be the same as those of the source-drain electrode 303. The connection electrode 304 is connected to the source-drain electrode 303 through the fourth via D4.

In an exemplary implementation, as shown in FIG. 4, the display substrate may further include a sixth insulation layer 316 located on a side of the connection electrode 304 away from the base substrate 310. The material and structure of the sixth insulation layer 316 may be provided to be the same as those of the first insulation layer 311. The sixth insulation layer 316 is referred to as a Planarization (PLN) layer.

As shown in FIG. 4, the sixth insulation layer 316 is provided with a fifth via D5 penetrating a thickness thereof, and the fifth via D5 is configured to expose at least a portion of the connection electrode 304.

As shown in FIG. 4, the support layer 400 is provided with a sixth via D6 penetrating a thickness thereof, and the sixth via D6 is configured to expose at least a portion of the fifth via D5 and expose at least a portion of the connection electrode 304. The anode 500 is connected to the connection electrode 304 through the sixth via D6 and the fifth via D5.

In an exemplary implementation, the light emitting elements 100 and the composite dielectric layer 200 may both be disposed on the planarization layer.

In an exemplary embodiment, as shown in FIG. 4, a distance from the surface of the support layer 400 away from the base substrate 310 and a surface of the planarization layer away from the substrate 310 is 0.2 microns to 0.8 microns, so that there is an interval along the third direction between the anode 500 and the planarization layer, so that a uniform light emitting film is easily formed on the anode 500 during the drying process of the ink.

Figure 5:
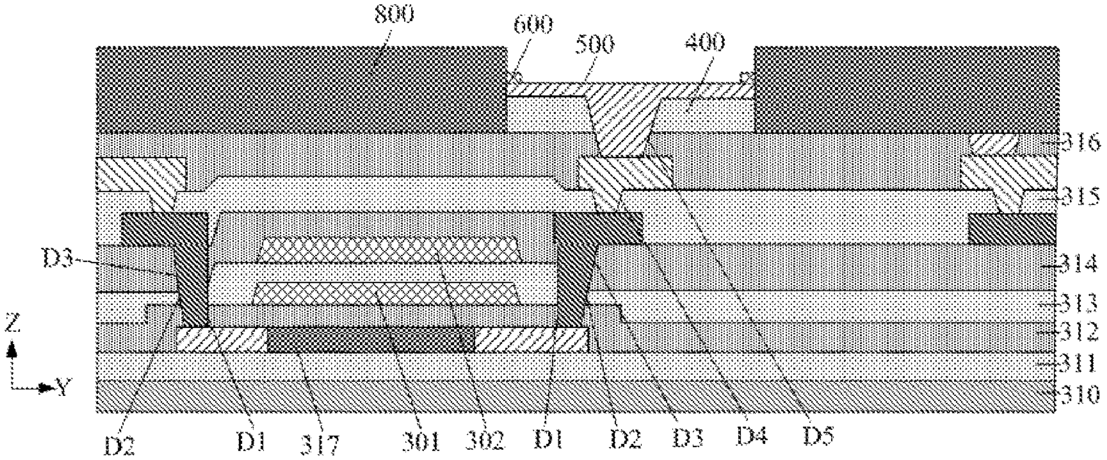
FIG. 5 is an enlarged partial cross-sectional view of a display substrate along a second direction according to an embodiment of the present disclosure.

FIG. 5 is an enlarged partial cross-sectional view of a display substrate along a second direction according to an embodiment of the present disclosure. As shown in FIG. 5, the structure of the display substrate can be referred to the aforementioned description of the structure shown in FIG. 4, which will not be repeated here.

The "patterning process" mentioned in the embodiments of the present disclosure includes processes such as deposition of a film layer, coating of a photoresist, mask exposure, development, etching, and stripping of photoresist, and is a mature preparation process in the related art. The deposition may be selected as a known process such as sputtering, vapor deposition, and chemical vapor deposition. The deposition may be performed by using a known process such as sputtering, chemical vapor deposition or the like, the coating may be performed by using a known coating process, and the etching may be performed by using a known method, which is not limited here.

A method for manufacturing a display substrate includes following steps:

(1) A base substrate 310 is prepared.

Such step may include the following operation: providing a carrier plate, which may include operations on the carrier plate, such as cutting, cleaning and drying.

(2) A pixel circuit layer is prepared.

On the base substrate 310 obtained by the aforementioned operations, a first insulation thin film and an active layer thin film are sequentially deposited, and a first insulation layer 311 and an active layer 317 are formed through a patterning process.

Subsequently, a second insulation thin film and a first metal thin film are sequentially deposited, and a second insulation layer 312 and a first gate 301 are formed through a patterning process.

Subsequently, a third insulation thin film and the second metal thin film are sequentially deposited, and a third insulation layer 313 and a second gate electrode 302 are formed through a patterning process.

Subsequently, a fourth insulation thin film is deposited, and a fourth insulation layer 314 is formed through a patterning process, and a third via D3 is formed in the fourth insulation layer 314. Portions of the third insulation layer 313 and the second insulation layer 312 whose orthographic projections on the base substrate 310 are overlapped with an orthographic projection of the third via D3 on the base substrate 310, are both etched away to form a second via D2 and a first via D1.

Subsequently, a third metal thin film is deposited, and a source-drain electrode 303 is formed through a patterning process, and the source-drain electrode 303 is connected to the active layer 317 through the third via D3, the second via D2, and the first via D1.

Subsequently, a fifth insulation thin film is deposited, and a fifth insulation layer 315 is formed through a patterning process, and a fourth via D4 is formed in the fifth insulation layer 315. The fourth via D4 exposes a portion of the source-drain electrode 303.

Subsequently, a fourth metal thin film is deposited, and a connection electrode 304 is formed through a patterning process, and the connection electrode 304 is connected to the source-drain electrode 303 through the fourth via D4.

On the base substrate obtained by the aforementioned operations, a sixth insulation thin film is deposited, and a sixth insulation layer 316 is formed through a patterning process.

(3) An isolation dam 800 is prepared.

On the base substrate obtained by the aforementioned operations, an isolation thin film is deposited, and the isolation dam 800 is formed through a patterning process.

(4) A support layer 400 is prepared.

On the base substrate obtained by the aforementioned operations, a support layer thin film is deposited, and the support layer 400 is formed through a patterning process. The support layer 400 is provided with a sixth via D6, and a portion of the sixth insulation layer 316 whose orthographic projection on the base substrate is overlapped with an orthographic projection of the sixth via D6 on the base substrate, is etched away to form a fifth via D5, and the fifth via D5 exposes a portion of the connection electrode 304.

(5) An anode 500 is prepared.

An electrode thin film is deposited on the support layer 400, and an anode 500 is formed through a patterning process. An orthographic projection of the anode 500 on the base substrate 310 may be overlapped with an orthographic projection of the support layer 400 on the base substrate 310.

(6) A partition layer 600 is prepared.

A partition thin film is deposited on the anode 500, and a partition layer 600 is formed through a patterning process. The partition layer 600 is in a form of ring, and the partition layer 600 and the anode 500 form an accommodation groove 601.

(7) A light emitting functional layer 700 is prepared.

On the basis of the above operations, at least a portion of the light emitting functional layer 700 may be formed in the accommodation groove 601 by using an ink jet printing manner. A drying process of the ink forming at least a portion of the light emitting functional layer 700 includes a first drying stage, a second drying stage and a third drying stage.

Figure 6A:
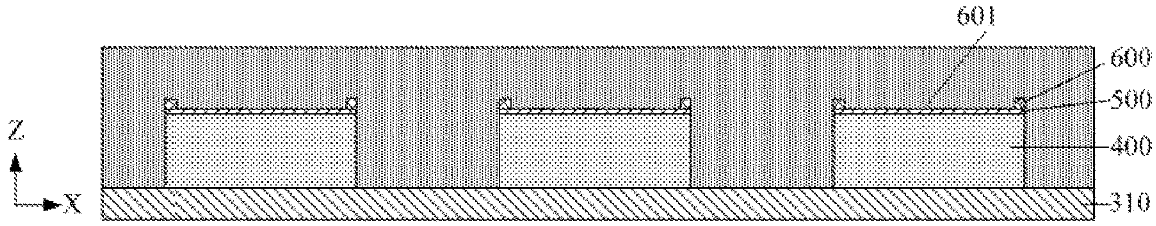
FIG. 6A is a schematic diagram in a first direction of ink in a first drying stage according to an embodiment of the present disclosure.

FIG. 6A is a schematic diagram in the first direction of ink in the first drying stage according to an embodiment of the present disclosure. As shown in FIG. 6A, an ink thin film covers the accommodation groove 601 and an area between two adjacent support layers 400.

Figure 6B:
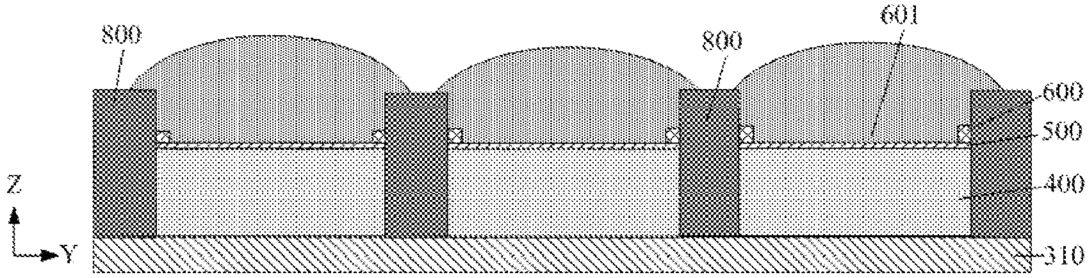
FIG. 6B is a schematic diagram in a second direction of ink in a first drying stage according to an embodiment of the present disclosure.

FIG. 6B is a schematic diagram in the second direction of ink in the first drying stage according to an embodiment of the present disclosure. As shown in FIG. 6B, an ink thin film covers a region defined by the isolation dam 800.

Figure 7A:
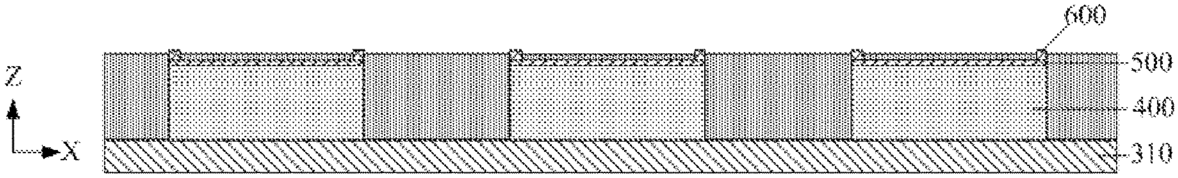
FIG. 7A is a schematic diagram in a first direction of ink in a second drying stage according to an embodiment of the present disclosure.

FIG. 7A is a schematic diagram in the first direction of ink in the second drying stage according to an embodiment of the present disclosure. As shown in FIG. 7A, during a drying process, an ink thin film is partitioned by the partition layer 600 along the first direction.

Figure 7B:
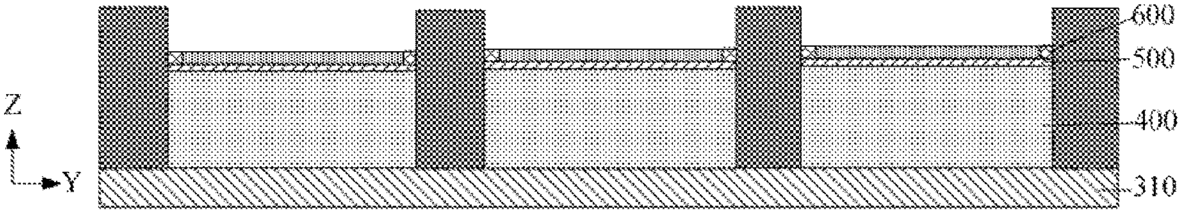
FIG. 7B is a schematic diagram in a second direction of ink in a second drying stage according to an embodiment of the present disclosure.

FIG. 7B is a schematic diagram in the second direction of ink in the second drying stage according to an embodiment of the present disclosure. As shown in FIG. 7B, during a drying process, an ink thin film is flush with the partition layer 600.

Figure 8A:
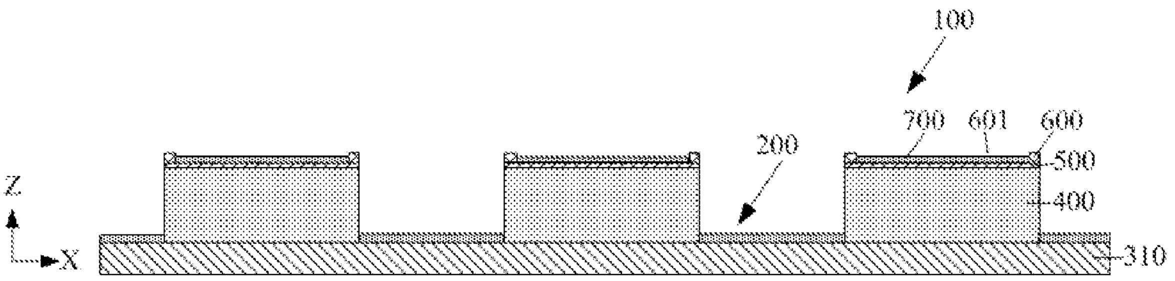
FIG. 8A is a schematic diagram in a first direction of ink in a third drying stage according to an embodiment of the present disclosure.

FIG. 8A is a schematic diagram in the first direction of ink in the third drying stage according to an embodiment of the present disclosure. As shown in FIG. 8A, during the drying process, at least a portion of the light emitting functional layer 700 is formed in the accommodation groove 601, and a composite dielectric layer 200 is formed between two adjacent support layers 400.

Figure 8B:
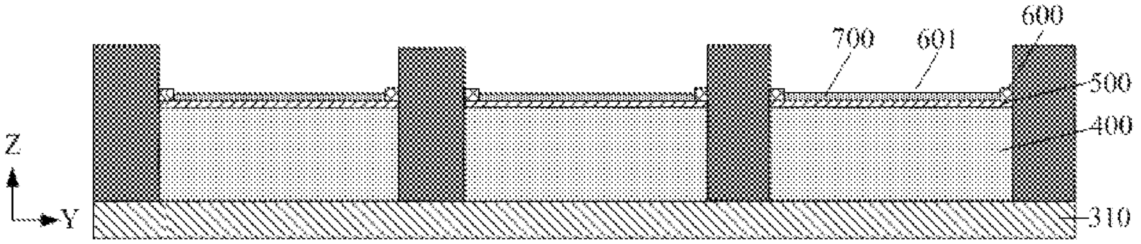
FIG. 8B is a schematic diagram in a second direction of ink in a third drying stage according to an embodiment of the present disclosure.

FIG. 8B is a schematic diagram in the second direction of ink in the third drying stage according to an embodiment of the present disclosure. As shown in FIG. 8B, during the drying process, at least a portion of the light emitting functional layer 700 is formed in the accommodation groove 601.

In some exemplary embodiments, the preparation of the isolation dam 800 and the preparation of the support layer 400 are interchangeable in terms of sequence. Or, the preparation of the isolation dam 800 and the preparation of the support layer 400 are performed simultaneously.

An embodiment of the present disclosure further provides a method for manufacturing a display substrate. The method includes:

forming at least one support layer and an isolation dam on a base substrate;

forming an anode and a partition layer on the support layer, wherein the partition layer and the anode form an accommodation groove;

depositing an ink thin film on the base substrate, wherein the ink thin film covers the accommodation groove and fills outside the support layer and is located in a region defined by the isolation dam;

making the ink thin film located inside the accommodation groove forming at least a portion of a light emitting functional layer, wherein the light emitting functional layer is connected with the anode;

making the ink thin film located outside the support layer forming a composite dielectric layer, wherein an orthographic projection of the composite dielectric layer on the base substrate is not overlapped with an orthographic projection of at least a portion of the light emitting functional layer on the base substrate, and a surface of the support layer away from the base substrate is higher than a surface of the composite dielectric layer away from the base substrate.

The method for manufacturing a display substrate according to the embodiment of the disclosure can be implemented by utilizing existing mature manufacturing equipment, which has the advantages of less modification on the existing process, simple manufacturing process, low production costs and high production precision, and has a good application prospect.

A display device is further provided in an embodiment of the present disclosure. The display device includes the display substrate described in any of the above embodiments. The display device may be any product or component with a display function, such as a mobile phone, a tablet computer, a television, a laptop computer, a digital photo frame, or a navigator.

Although the embodiments disclosed in the present disclosure are described as above, the described contents are only embodiments which are used for facilitating understanding of the present invention, and are not intended to limit the present disclosure. Any skilled person in the art to which the present invention pertains can make any modifications and alterations to forms and details of implementation without departing from the spirit and scope of the present invention. However, the patent protection scope of the present invention should be subject to the scope defined by the appended claims.

The invention claimed is:

1. A display substrate, comprising a base substrate and a light emitting structure layer disposed on the base substrate, wherein the light emitting structure layer comprises at least one light emitting element and a composite dielectric layer located on at least one side of the at least one light emitting element; the at least one light emitting element comprises a support layer, and an anode, a partition layer and a light emitting functional layer disposed on the support layer, a surface of the support layer away from the base substrate is higher than a surface of the composite dielectric layer away from the base substrate, the partition layer and the anode form an accommodation groove, at least a portion of the light emitting functional layer is disposed in the accommodation groove and connected with the anode, and at least a portion of the light emitting functional layer and the composite dielectric layer are disconnected from each other; wherein a plurality of light emitting elements are arranged at intervals to form a light emitting element group, and the composite dielectric layer is disposed between adjacent light emitting elements in the light emitting element group.

2. The display substrate according to claim 1, wherein the partition layer is disposed at an edge of the support layer, orthographic projections of the partition layer and the anode on the base substrate are not overlapped with each other; or the partition layer is disposed at an edge of the anode.

3. The display substrate according to claim 1, wherein a distance from a surface of the light emitting functional layer located in the accommodation groove away from the support layer to the support layer is not greater than a distance from a surface the partition layer away from the support layer to the support layer.

4. The display substrate according to claim 1, wherein the partition layer is in a form of a ring and is disposed around a periphery of the anode.

5. The display substrate according to claim 4, wherein a ring width of the partition layer is less than 3.0 microns.

6. The display substrate according to claim 1, further comprising a pixel circuit layer disposed on the base substrate and a planarization layer disposed on the pixel circuit layer, wherein the light emitting structure layer is disposed on the planarization layer.

7. The display substrate according to claim 6, wherein a distance from the surface of the support layer away from the base substrate to a surface the planarization layer away from the base substrate is 0.2 microns to 0.8 microns.

8. The display substrate according to claim 1, wherein the partition layer comprises an organic insulation material or an inorganic insulation material.

9. The display substrate according to claim 1, wherein a thickness of the partition layer is 30 nm to 100 nm.

10. The display substrate according to claim 1, wherein the light emitting functional layer comprises a plurality of film layers; the composite dielectric layer and at least one film layer of the light emitting functional layer comprise a same material; the composite dielectric layer and the at least one film layer of the light emitting functional layer comprising the same material are disconnected from each other at the partition layer.

11. The display substrate according to claim 1, wherein the light emitting structure layer further comprises an isolation dam disposed on the base substrate, the isolation dam surrounds a periphery of the light emitting element group, and a surface of the isolation dam away from the base substrate is higher than a surface of the partition layer away from the base substrate.

12. The display substrate according to claim 11, wherein the support layer and the partition layer are made of a same material as the isolation dam.

13. A display device, comprising the display substrate of claim 1.

14. The display device according to claim 13, wherein the partition layer is disposed at an edge of the support layer, orthographic projections of the partition layer and the anode on the base substrate are not overlapped with each other; or the partition layer is disposed at an edge of the anode.

15. The display device according to claim 13, wherein a distance from a surface of the light emitting functional layer located in the accommodation groove away from the support layer to the support layer is not greater than a distance from a surface the partition layer away from the support layer to the support layer.

16. The display device according to claim 13, wherein, the partition layer is in a form of a ring and is disposed around a periphery of the anode.

17. The display device according to claim 16, wherein a ring width of the partition layer is less than 3.0 microns.

18. The display device according to claim 13, further comprising a pixel circuit layer disposed on the base substrate and a planarization layer disposed on the pixel circuit layer, wherein the light emitting structure layer is disposed on the planarization layer.

19. A method for manufacturing a display substrate, comprising:

forming at least one support layer and an isolation dam on a base substrate;

forming an anode and a partition layer on the at least one support layer, wherein the partition layer and the anode form an accommodation groove;

depositing an ink thin film on the base substrate, wherein the ink thin film covers the accommodation groove and fills outside the support layer and is located in a region defined by the isolation dam;

making the ink thin film located inside the accommodation groove form at least a portion of a light emitting functional layer, wherein the light emitting functional layer is connected with the anode; and making the ink thin film located outside the support layer form a composite dielectric layer, wherein an orthographic projection of the composite dielectric layer on the base substrate and an orthographic projection of at least a portion of the light emitting functional layer on the base substrate are not overlapped with each other, and a surface of the support layer away from the base substrate is higher than a surface of the composite dielectric layer away from the base substrate; wherein a plurality of light emitting elements are arranged at intervals to form a light emitting element group, and the composite dielectric layer is disposed between adjacent light emitting elements in the light emitting element group.

* * * * *